US009475093B2

(12) United States Patent
Hajati et al.

(10) Patent No.: US 9,475,093 B2
(45) Date of Patent: Oct. 25, 2016

(54) PIEZOELECTRIC ULTRASONIC TRANSDUCER ARRAY WITH SWITCHED OPERATIONAL MODES

(71) Applicants: Arman Hajati, Santa Clara, CA (US); Deane Gardner, Cupertino, CA (US)

(72) Inventors: Arman Hajati, Santa Clara, CA (US); Deane Gardner, Cupertino, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 466 days.

(21) Appl. No.: 14/045,713

(22) Filed: Oct. 3, 2013

(65) Prior Publication Data

US 2015/0097468 A1 Apr. 9, 2015

(51) Int. Cl.

| | |
|---|---|
| ***H01L 41/09*** | (2006.01) |
| ***H01L 41/113*** | (2006.01) |
| ***B06B 1/06*** | (2006.01) |
| ***H01L 41/08*** | (2006.01) |

(52) U.S. Cl.

CPC ......... *B06B 1/0622* (2013.01); *H01L 41/0825* (2013.01); *H01L 41/098* (2013.01)

(58) Field of Classification Search

CPC ................................. H04R 17/00; G10K 9/22

USPC .................................................. 310/311–371

See application file for complete search history.

(56) References Cited

U.S. PATENT DOCUMENTS 5,527,741 A 6/1996 Cole et al.
6,584,861 B1 7/2003 Jespersen
6,676,602 B1 * 1/2004 Barnes .................. A61B 8/483 600/443
6,894,425 B1 5/2005 Solomon et al.
7,388,318 B2 6/2008 Yamada et al.
8,608,672 B2 * 12/2013 Vortman ............ G01S 15/8925 601/2
9,096,422 B2 * 8/2015 Hajati ..................... B81B 7/008
2002/0083771 A1 7/2002 Khuri-Yakub et al.
2003/0187356 A1 10/2003 Wakabayashi et al.
2004/0004649 A1 1/2004 Bibl et al.
2005/0154312 A1 7/2005 Bruestle
2005/0237858 A1 10/2005 Thomenius et al.
2005/0248235 A1 11/2005 Namerikawa et al.
2005/0248238 A1 11/2005 Yamada et al.

(Continued)

FOREIGN PATENT DOCUMENTS

JP 2001320103 11/2001

OTHER PUBLICATIONS

"PCT, International Search Report and Written Opinion of the International Searching Authority for International Application No. PCT/US2014/054595", (Dec. 19, 2014), Whole Document.

(Continued)

*Primary Examiner* — Thomas Dougherty

(74) *Attorney, Agent, or Firm* — Blakely, Sokoloff, Taylor & Zafman LLP

(57) ABSTRACT

Switchable micromachined transducer arrays are described where one or more switches, or relays, are monolithically integrated with transducer elements in a piezoelectric micromachined transducer array (pMUT). In embodiments, a MEMS switch is implemented on the same substrate as the transducer array for switching operational modes of the transducer array. In embodiments, a plurality of transducers are interconnected in parallel through MEMS switch(es) in a first operational mode (e.g., a drive mode) during a first time period, and are then interconnected through the MEMS switch(es) with at least some of the transducers in series in a second operational mode (e.g., a sense mode) during a second time period.

20 Claims, 12 Drawing Sheets

(56) References Cited

U.S. PATENT DOCUMENTS

| | | | |
|---|---|---|---|
| 2007/0013269 | A1 | 1/2007 | Huang |
| 2007/0259468 | A1 | 11/2007 | Chen et al. |
| 2008/0042519 | A1 | 2/2008 | Marshall et al. |
| 2008/0048211 | A1 | 2/2008 | Khuri-Yakub et al. |
| 2009/0230820 | A1 | 9/2009 | Nudelman et al. |
| 2012/0206014 | A1 | 8/2012 | Bibl et al. |
| 2012/0235539 | A1 | 9/2012 | Bibl et al. |
| 2012/0299439 | A1 | 11/2012 | Huang |
| 2013/0000758 | A1 | 1/2013 | Hoen et al. |

OTHER PUBLICATIONS

"PCT, International Search Report and Written Opinion of the International Searching Authority for International Application No. PCT/US2014/065964", (Feb. 23, 2015), Whole Document.

International Preliminary Report on Patentability from PCT/US2014/054595 mailed Apr. 14, 2016, 10 pgs.

Non-Final Office Action from U.S. Appl. No. 14/103,672 mailed Feb. 12, 2016, 11 pgs.

International Preliminary Report on Patentability for PCT International Application No. PCT/US2014/065964 mailed on Jun. 23, 2016, 7 pgs.

* cited by examiner

| Mode | $S_1$ | $S_2$ |
|---|---|---|
| Parallel (Tx) | closed | open |
| Series (Rx) | open | closed |

PIEZOELECTRIC ULTRASONIC TRANSDUCER ARRAY WITH SWITCHED OPERATIONAL MODES

BACKGROUND

1. Technical Field

Embodiments of the invention generally relate to arrays of piezoelectric transducers, and more specifically pertain to Microelectromechanical systems (MEMS) switched piezoelectric transducer arrays.

2. Background Art

Transducer arrays are utilized in many applications. Print heads for inkjet or 3D printers are one widespread application, for example. Transducer arrays also find application in ultrasonic imaging. Transducer arrays often employ capacitive or piezoelectric transducer elements. Generally, piezoelectric transducer elements (transducers) include a piezoelectric membrane capable of mechanical deflection of the membrane in response to a time-varying driving voltage. For print heads, the membrane is driven to expel ink or other fluid from a chamber in a controllable manner, for ultrasonic piezoelectric transducer devices the membrane is disposed over a closed cavity and driven to generate a high frequency pressure wave in a propagation medium (e.g., air, water, or body tissue) in contact with an exposed outer surface of the transducer element. This high frequency pressure wave can propagate into other media. The same piezoelectric membrane can also receive reflected pressure waves from the propagation media and convert the received pressure waves into electrical signals. The electrical signals can be processed in conjunction with the driving voltage signals to obtain information on variations of density or elastic modulus in the propagation media.

While many transducer devices that use piezoelectric membranes may be formed by mechanically dicing a bulk piezoelectric material or by injection molding a carrier material infused with piezoelectric ceramic crystals, devices can be advantageously fabricated inexpensively to exceedingly high dimensional tolerances using various micromachining techniques (e.g., material deposition, lithographic patterning, feature formation by etching, etc.), commonly referred to a piezoelectric micromachined transducers (pMT), and more specifically a piezoelectric micromachined ultrasonic transducer (pMUT) when configured for ultrasonic transduction.

One-dimensional (1D) transducer arrays are commonly employed where n channels are provided and each of the n channels electrically drives, or senses, m transducers as a single population. During operation of the array, given one(s) of the n channels in a drive or sense mode having potentials applied or sensed from a channel signal line coupled in electrical parallel to the m transducers. Signals to/from the n channels of the 1D array may then be achieved through a multiplexing technique, such as time delayed scanning.

FIG. 1A illustrates a 1D pMUT array 100 having a plurality of channels 110, 120, 130, 140 disposed over an area defined by a first dimension, x and a second dimension y, of a substrate 101. Each of the channels (e.g., 110) is electrically addressable as one of n channels independently from any other drive/sense channels (e.g., 120 or 130) with the drive/sense channel addressing each of the elements 110A, 110B . . . 110N. A reference (e.g., ground) electrode rail is also typically found in a plane below the drive/sense channel routing. The drive/sense channels 110, 120 represent a repeating cell in the 1D array 100 with the first drive/sense channel 110 coupled to a first bus 127 and the adjacent drive/sense channel 120 coupled a second bus 128 to form a interdigitated finger structure. The drive/sense channels 130, 140 repeat the interdigitated unit structure with additional cells forming a 1D electrode array of arbitrary size (e.g., 128 channels, 256 channels, etc.).

Driving and sensing the many channels within a micromachined transducer array is technically challenging because the sheer number of channels requires complex device interconnection, such as multi-layered flex assemblies, between the arrayed transducer device (e.g., ultrasonic transducer head, etc.) and the electrical control/sampling circuitry, often implemented in CMOS, off the transducer substrate. As an example of such an architecture, FIG. 1B is a cross-sectional side view of the 1D pMUT array 100, disposed on the substrate 101 and coupled by a flex cable extending off the substrate 101 to an ASIC (CMOS) controller 112. With such this architecture, increasing complexity in the transducer device array and/or interconnection of the transducer elements incurs significant overhead off the array substrate, and therefore a fixed, single mode of operation is designed into the physical architecture of the transducer array. However, such fixed, single mode operation may limit the performance and/or applications of the transducing device disadvantageously.

Therefore, transducer array structures, architectures, and techniques enabling multi-mode array operation with a minimal increase in the complexity of device interconnection, multi-layered flex assemblies, etc., are advantageous.

SUMMARY OF THE DESCRIPTION

Switched micromachined transducer arrays are described herein. The switch may be a series switch, as in a pass gate for example. In an embodiment, a MicroElectroMechanical Systems (MEMS) switch, or relay, is integrated with a transducer element. In embodiments, the MEMS switch is implemented in the same substrate as the transducer array, or in a separate substrate bonded to that of the transducer array, to implement one or more circuit topology switching function, logic gate, shift register, transducer control, or transducer element addressing function rather than relegating all such functions to CMOS ASICs coupled to the transducer array substrate through interconnects. In embodiments, one or more first piezoelectric transducer element of an array is interconnected to one or more second piezoelectric transducer element of the array through at least one MEMS switch to provide switchable operational modes of the array. In certain embodiments, a MEMS switch employs the same piezoelectric material employed in the transducer. In other embodiments, the MEMS switch is capacitive, electrostatic or electromagnetic while the transducer is capacitive or piezoelectric.

In embodiments, a switch controller coupled to one or more switches actuates one or more of the switches to couple one or more sense or drive circuit to transducer elements interconnected in a specific electrical topology at a given time. In embodiments, a transducer element or plurality of elements within a given channel of the array may be switched by one or more switches between electrical parallel and series circuit configurations. In certain such embodiments, a transducer array is operated in a drive mode with more transducers of a channel in electrical parallel than when operated in a sense mode. In further embodiments, all transducers within a channel are in electrical parallel during a drive operational mode and then one or more of the transducers are switched into electrical series during a sense operational mode. In further embodiments, the switch controller is implemented with CMOS logic on a substrate separate from that of the transducer array. In further embodiments, a single switch control signal line is coupled to MEMS switches controlling interconnection of transducers across a plurality of separate channels in a transducer array.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

Switched micromachined transducer arrays including switchable transducer elements are described herein. Features of certain embodiments are discussed herein in the context of configuring various operational modes of a pMT with MEMS switches. However, such discussion may be extended to apply to configuring such operational modes with any of a variety of additional or alternative types of switch elements, according to different embodiments. By way of illustration and not limitation, configuration (e.g. including reconfiguration) of a pMUT according to an embodiment may include operation of any of a variety of combinations of one or more MEMS relays, solid-state relays, miniaturized electromechanical relays and/or the like.

Figure 1A:
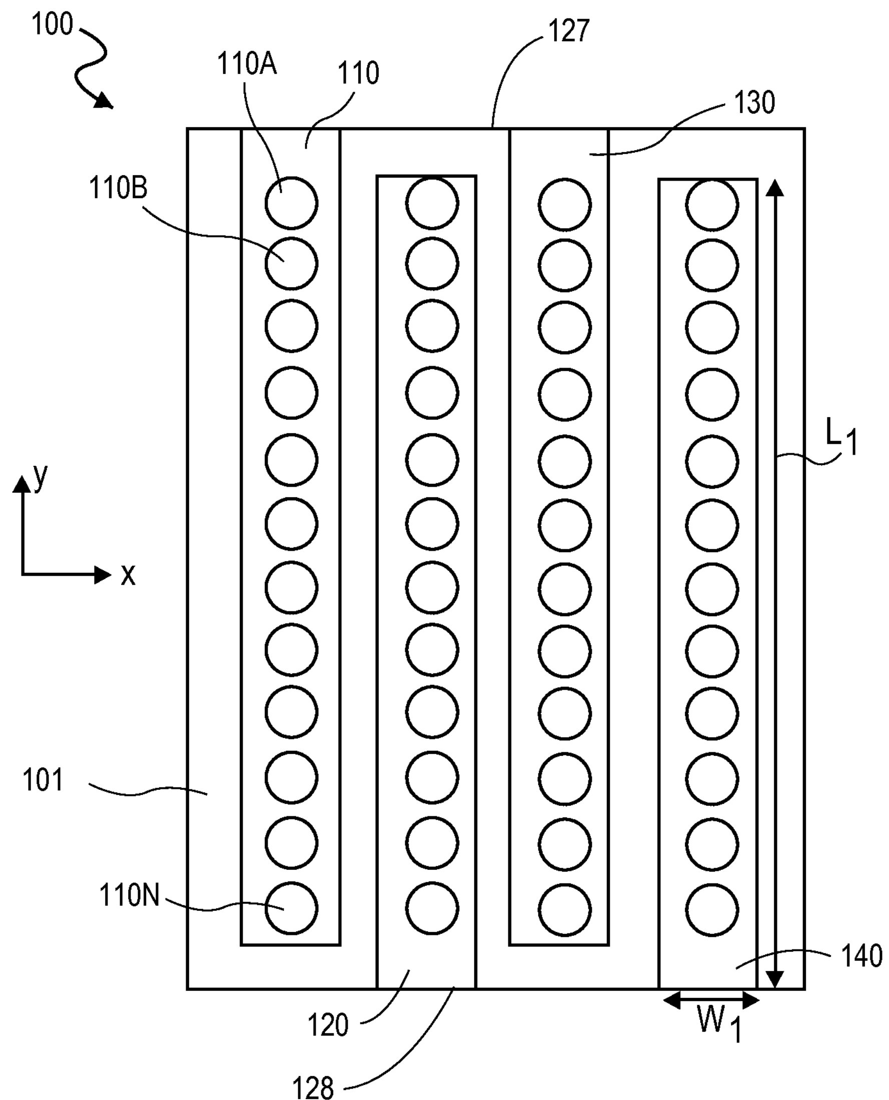
FIG. 1A is a plan view of a conventional 1D micromachined transducer array with a plurality of transduces.
Figure 1B:
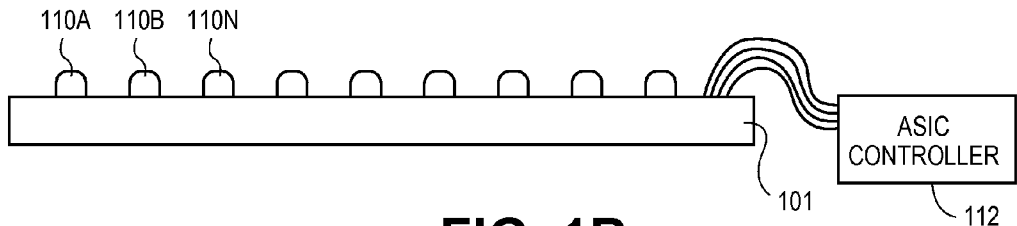
FIG. 1B is a cross-sectional side view of a substrate with the 1D micromachined transducer array depicted in FIG. 1A, and coupled by a flex cable to a controller ASIC.
Figure 1C:
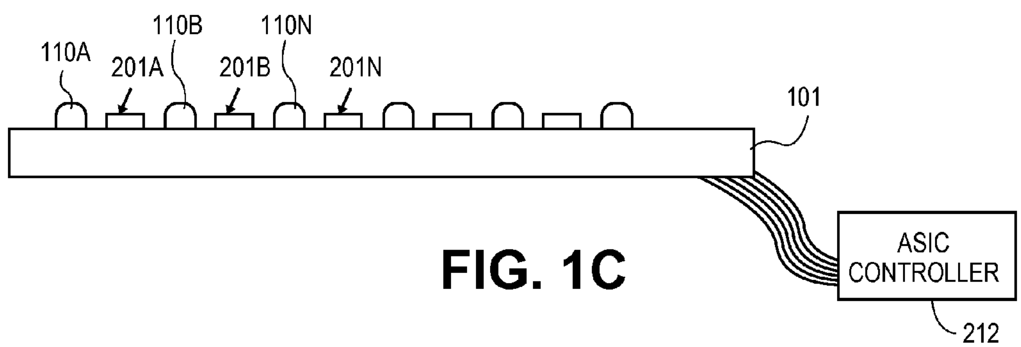
FIG. 1C is a cross-sectional side view of a substrate with a transducer array integrated with MEMS switches on a same substrate, and coupled by a flex cable to a controller ASIC, in accordance with embodiments.

In embodiments, a MEMS switch is integrated with transducer elements (transducers) of an array. In one exemplary embodiment one or more MEMS switches are employed to selectably interconnect a plurality of transducers into more than one interconnect architecture. In certain such embodiments, one of more MEMS switches are employed to interconnect at least some of the transducers in electrical parallel during a first mode and then at least some of the transducers in electrical series during a second mode. The MEMS switches associated with each channel of a multi-channel array may be further controlled by one or more switch control signal, thereby reducing interconnect routing demands for the transducer array and, where the array is fabricated on a substrate separate from that of the drive/sense and/or switch control circuitry, bandwidth of cable assemblies between the substrates can be minimal relative to those lacking switchable transducer elements. FIG. 1C is a cross-sectional side view of a substrate 101 with a mircomachined transducer array including transducer elements 110A, 110B, 110N integrated with MEMS switches 201A, 201B, 201N on the substrate 101, which is then coupled to a controller ASIC 212 by a flex cable, in accordance with embodiments. For such embodiments, the ASIC 212 is operable to both send and receive signals associated with the ultrasonic drive and sense modes of the transducer elements 110A, 110B, 110N and to further control switching of the MEMS switches 201A, 201B, 201N.

Figure 1D:
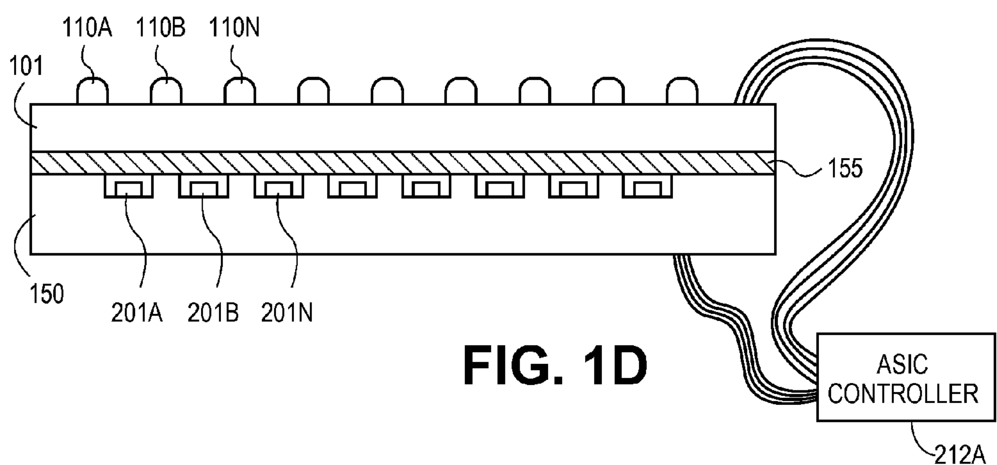
FIG. 1D is a cross-sectional side view of a first substrate with a transducer array bonded to a second substrate with MEMS switches to form a 3D integrated device that is coupled by a flex cable to a controller ASIC, in accordance with embodiments.

In embodiments, MEMS switches are integrated with transducer arrays through 3D integration techniques. For such embodiments, a substrate with MEMS switches is physically bonded or otherwise affixed to a substrate with micromachined transducer arrays, either at a wafer-level or a chip-level. FIG. 1D is a cross-sectional side view of a first substrate 101 with a transducer array including transducer elements 110A, 110B, 110N, bonded to a second substrate 150 having MEMS switches 201A, 201B, 201N, to form a 3D integrated device that is then coupled by a flex cable to the controller ASIC 212, in accordance with embodiments. For such embodiments, any bonding technique known in the art (e.g., a eutectic layer 155, etc.) may be utilized.

Figure 1E:
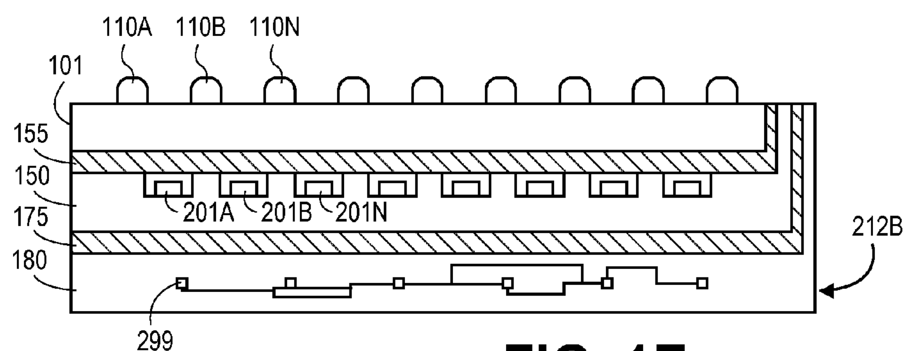
FIG. 1E is a cross-sectional side view of a first substrate with a transducer array bonded to a second substrate with MEMS switches bonded to a CMOS substrate to form a fully integrated pMUT device.

In embodiments, MEMS switches are integrated with micromachined transducer arrays and with CMOS logic through 3D integration techniques. For such embodiments, a substrate with MEMS switches is physically affixed to a substrate with transducer arrays, which is further affixed to a substrate on which CMOS circuitry including transistors 299 is disposed. FIG. 1E is a cross-sectional side view of a first substrate 101 with an array (e.g., a pMUT array) including transducer elements 110A, 110B, 110N, bonded to a second substrate 150 having MEMS switches 201A, 201B, 201N, bonded to a third substrate 180 to form a 3D integrated device that is then packaged. For such highly integrated embodiments, the complexity of flex cable connections to the packaged device can be greatly reduced. Here too, any 3D stacking techniques known in the art (e.g., a eutectic layer 155, a build-up layer 175, etc.) may be utilized.

Generally, switched micromachined transducer arrays described herein may be premised on any known transducer technology, including, but not limited to, capacitive and piezoelectric principles. In the certain embodiments, the MEMS switches rely on the same transduction principles as those of the transducer array to implement a dynamically reconfigurable interconnect topology of the transducer elements in the array. For example, where the transducer array employs capacitive transducer elements, an integrated MEMS switch employs a capacitively controlled switching element, and for a piezoelectric transducer array, an integrated MEMS switch employs a piezoelectric switching element. Notably, even where a same transduction principle is shared between a MEMS switch and an arrayed transducer, the resonant frequency of the MEMS switch may be considerably different than that of a transducer element (e.g., significantly higher or lower). Also while a common transduction principle between the MEMS switch and the arrayed transducers is advantageous from the standpoint of most directly integrating a MEMS switch into a given transducer fabrication process, alternative embodiments where a MEMS switch and the arrayed transducers rely on different transduction principles (e.g., a capacitive MEMS switch integrated with a piezoelectric transducer, etc.) are also possible. Similarly, while detailed description is provided primarily in the context of piezoelectric transducer arrays, in part because of technical advantages over competing technologies (e.g., piezoelectric transducers currently achieve higher sensitivity than capacitive transducers), and in part for sake of clarity of description, one of skill in the art will appreciate the principles described herein may be readily applied to other known transducer technologies (e.g., capacitive, electromagnetic, etc.).

Figure 2A:
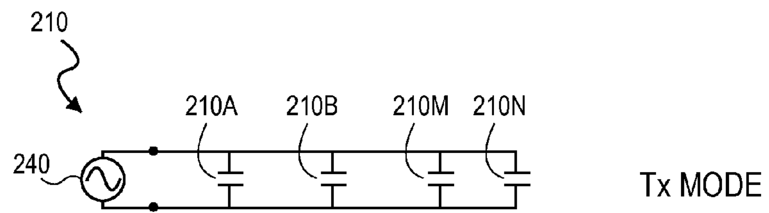
FIG. 2A is a schematic of a multi-mode transducer array circuit topology in a first operational mode, in accordance with an embodiment.

In embodiments, a micromachined transducer array includes micromachined transducer elements configurable into alternate operational modes. FIG. 2A is a schematic of a multi-mode transducer array 210 in a first operational mode, in accordance with an embodiment. Each of the transducers 210A, 210B, 210M, and 210N includes a membrane (piezoelectric, capacitive, etc.) having a fundamental resonance anywhere within a wide frequency band, depending on design and application. In exemplary embodiments, the membrane has resonance in the ultrasonic band (e.g., 100 kHz-100 MHz and more specifically 1 MHz-50 MHz) such that the array 210 is a piezoelectric micromachined ultrasonic transducer. Regardless of whether a capacitive or piezoelectric transduction scheme is employed within the array 210, the plurality of transducers 210A-210N may be electrically represented as capacitors coupled across a pair of electrodes driven by a generator 240. As shown, the electrodes are interconnected to place the plurality of capacitors in electrical parallel (i.e., all transducers share a same top/drive electrode and all transducers share a same bottom/reference electrode). In one such embodiment, these parallel-interconnected capacitors form at least a portion of one channel in a multi-channeled array. In the exemplary embodiment, all transducers of a given channel in a multi-channeled array are configured in electrical parallel during a transmit (Tx) mode of the channel.

Figure 2B:
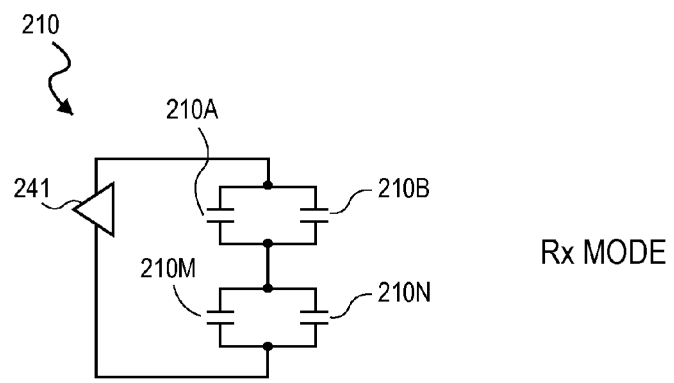
FIG. 2B is a schematic of a multi-mode transducer array circuit topology in a second operational mode, in accordance with an embodiment.

FIG. 2B is a schematic of the array 210 in a second operational mode, in accordance with an embodiment. As shown, transducers 210A, 210B, 210M, and 210N have electrodes interconnected to place at least some of the plurality of capacitors in electrical series (i.e., a bottom/sense electrode of one transducer is coupled to top/drive electrode of another transducer). In one such embodiment, one channel in a multi-channeled array includes serially-interconnected capacitors. Generally, in the serial circuit topology, there is at least one fewer transducer in parallel with other transducers than there is in the parallel topology in the first operational mode (e.g., depicted in FIG. 2A). Any number of transducers may be interconnected into any parallel/serial configuration, and in certain embodiments all transducers in parallel in the first mode are interconnected in a purely serial configuration in the second mode. In the exemplary embodiment depicted in FIG. 2B, a first subset of the plurality of transducers (e.g., the transducers 210A and 210B) have their respective pairs of electrodes in electrical parallel, as do a second subset of the plurality of transducers (e.g., the transducers 210M and 210N). The first and second subsets are then configured into series for a parallel-serial arrangement across a sensing circuitry 241. In this exemplary embodiment, not all transducers of a given channel in a multi-channeled array are configured in electrical parallel during a receive (Rx) mode of the channel. In certain such embodiments, each of the first and second subsets of transducers includes half of the total number of transducers that are interconnected in electrical parallel during a Tx mode (e.g., half the transducers in a given channel of a multi-channeled array). Of course, a plurality of transducers within a channel may be divided into a greater number of subsets with a concomitant increase in switching complexity.

In embodiments, a transducer array is switched between operational modes by one or more switches electrically interconnecting the transducers. Generally, the one or more switch(es) is(are) electrically switchable between at least first state and second state. In the first state, the one or more switches interconnect at least two transducers of the plurality in electrical parallel, and in the second state the one or more switches interconnect the at least two transducers in electrical series. For example, in certain embodiments, the one or more switches are to switch between the Tx mode (e.g., switch(es) in the first state) and the Rx mode (e.g., switch(es) in the second state) for the channel transducers depicted in FIGS. 2A and 2B.

Figure 2C:
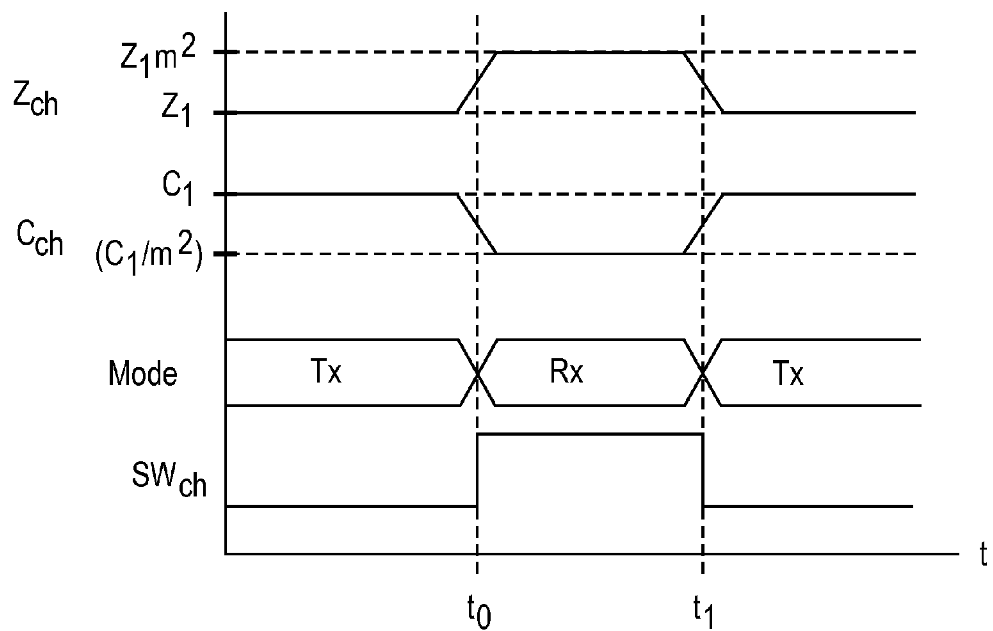
FIG. 2C is a timing diagram illustrating a multi-mode transducer array switching between transmit and receive modes corresponding to one or more switch states, in accordance with an embodiment.

FIG. 2C is a timing diagram illustrating a multi-mode transducer array switching between transmit and receive modes (e.g., FIGS. 2A and 2B) corresponding to states of one or more switches, in accordance with an embodiment. At time t0, one or more switches SWch interconnecting two or more of a plurality of transducers in a channel are switched from a first state (e.g., logic low) to a second state (e.g., logic high). With the switches SWch in the second state, transducers that were previously (prior to time t0) configured in parallel and having a correspondingly high channel capacitance (Cch) and a low channel impedance (Zch) advantageous for a transmit mode, are reconnected into a circuit topology that is, at least in part, serial with a correspondingly lower channel capacitance (Cch) and a higher channel impedance (Zch) advantageous for a signal receiving mode.

In the Tx mode, the parallel interconnection of the transducers enables excitation with a relatively small voltage at a relatively high current, while the more serial interconnection of the transducers in the Rx mode enables an output voltage that is relatively high at a relatively low current output. For example, some m transducers may be transitioned at time t0 from being configured in parallel with one another for the Tx mode to being configured in series with one another for the Rx mode. In an idealized example of the m transducers having identical characteristics, a total capacitance Cch across the m transducers may transition from a capacitance value $C_1$ for the Tx mode to a comparatively small capacitance value $C_1/m^2$ for the Rx mode. By contrast, a total impedance Zch across the m transducers may transition from an impedance value $Z_1$ for the Tx mode to a comparatively large impedance value $Z_1 \cdot m^2$ for the Rx mode. Correspondingly, the transition from the Tx mode to the Rx mode at t0 may cause a level of current through the m transducers to be reduced at least initially by a factor of (1/m) and/or may cause a level of voltage across the m transducers to be increased at least initially by a factor of m.

At time t1, the switch(es) return to the first state, for example for another cycle of transmission. Switching between a low-impedance, low-voltage transmit mode and a high-impedance, high-voltage receive mode enables greater performance (e.g., low noise sensing) and provides a greater degree of freedom in the design of the signal sensing amplifier circuitry, for example.

Figure 3A:
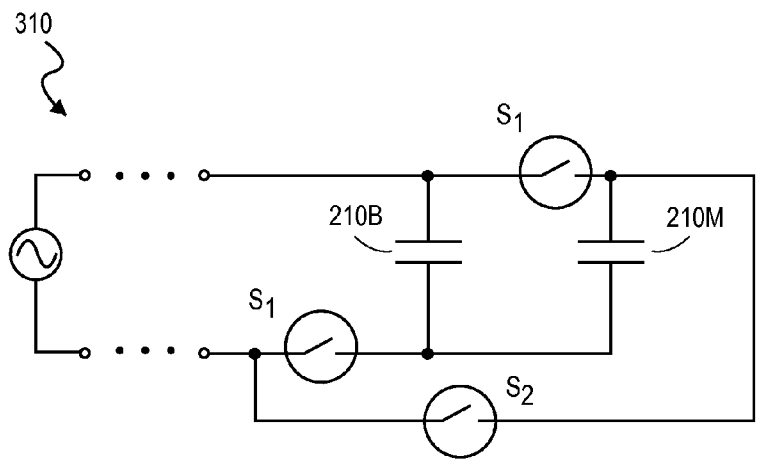
FIG. 3A is a schematic of a switchable transducer channel array configured for polarity reversal of two adjacent transducers, in accordance with an embodiment.

FIG. 3A illustrates a circuit 310 which may be configured to interconnect a pair of electrodes of the transducer 210B either in parallel or in series with the pair of electrodes in the transducer 210M. Transducers 210B, 210M may be piezoelectric, in an embodiment, wherein polarity is not a factor in switching between a parallel configuration and a series configuration. Circuit 310 may include S1 switches which, with respect to one another, are to provide similar switching operation and a switch S2 which is to provide a switching operation complementary to that of the S1 switches. For example, the S1 switches may both be concurrently in the same closed (or open) state based on a switch signal while the switch S2 of circuit 310 is to be in a complementary open (or closed) state based on that switch signal. Such a switch signal may include SWch of FIG. 2C, for example.

In circuit 310, respective reference electrodes of transducers 210B, 210M may be coupled to one another independent of any switch/relay, whereas respective drive/sense electrodes of transducers 210B, 210M may be coupled to one another via a S1 switch. Another S1 switch may be coupled in series with a S2 switch between the respective reference electrodes of transducers 210B, 210M and the drive/sense electrode of transducer 210M. In a Tx mode of operation, the S1 switches of circuit 310 may be closed, and the S2 switch open, resulting in transducers 210B, 210M being coupled in parallel with one another. By contrast, a Rx mode of operation may include the S1 switches of circuit 310 being open, and the S2 switch being closed to couple transducers 210B, 210M in series with one another.

While any technology known in the art may be utilized for the one or more switches described herein, the switch technology is, in the exemplary embodiment, one which is compatible with the transducer array substrate and compatible with the operations employed in the fabrication of the transducers. In one exemplary embodiment, the one or more switches utilized to switch operational modes of a transducer array are MEMS switches. A single MEMS switch may comprise a switching member, or throw, that is either normally closed (NC) or normally opened (NO), as dependent at least on the electromechanics of the switching member. Depending on the embodiment, any of electrostatic, piezoelectric and electromagnetic techniques may be utilized to achieve a lateral or vertical deflection of the switching member in the MEMS switch. Also depending on the embodiment, the switching frequency of the MEMS switch may vary widely as a function of the MEMS switch function. In one embodiment, the MEMS switch is an RF or microwave MEMS switch having microsecond actuation times, or better. The MEMS switch may be capacitive with a sufficiently small capacitance to capacitively couple all frequencies within the bandwidth of a transducer element. Capacitive switch embodiments have advantages over ohmic MEMS switch embodiments with respect to operational resilience, manufacturability, etc. MEMS switches based on ohmic contact are advantageous for the transducer 'drive' mode, in which high voltage pulses with non-zero DC value are transmitted. Nevertheless, the MEMS switch employed in the embodiments described herein may also be implemented as an ohmic switch making metal-to-metal contact in the closed state. For either capacitive or ohmic switch embodiments, the MEMS switch is to cause a conductive path between switched poles to undergo a change from a large impedance in an open switch state to low impedance (e.g., a short circuit) in a closed switch state. In embodiments, at least one of a reference electrode and the drive/sense electrode is coupled to a pole of a MEMS switch implemented over the same substrate as the transducer membrane is disposed. In other words the MEMS switch is monolithically integrated onto a transducer substrate. Such MEMS switch(es) may employ one or more piezoelectric, electrostatic or electromagnetic switching member, and as described further elsewhere herein, for one exemplary piezoelectric transducer embodiment, the MEMS switch employs the same piezoeoelectric material as the transducer.

Figure 3B:
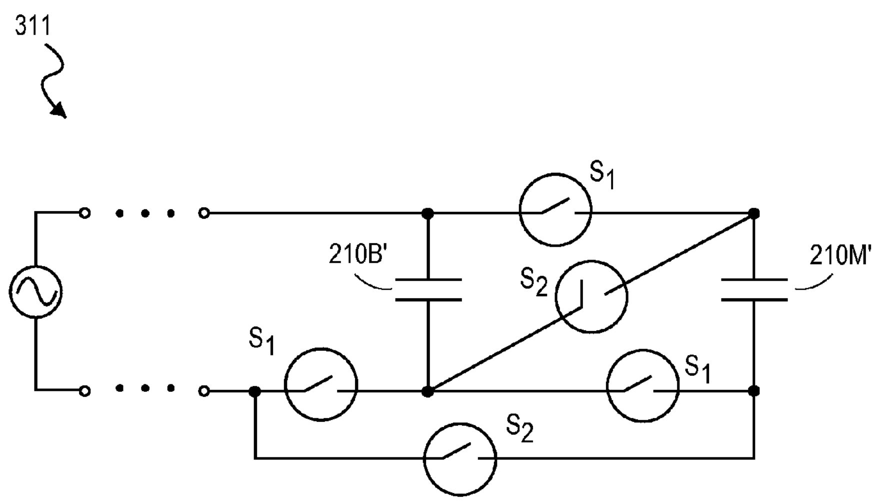
FIG. 3B is a schematic of an exemplary implementation of a four-way MEMS switch using pass gates for reversing polarity of two adjacent transducers in a channel of a transducer array, in accordance with an embodiment.

While there are many switch architectures that may be implemented to switch transducer electrode interconnections in the manner depicted in FIG. 3A, FIG. 3B provides a further illustration of another technique to employ such switching. As shown in FIG. 3B, a circuit 311 may be configured to interconnect a pair of electrodes of a transducer 210B' either in parallel or in series with the pair of electrodes in the transducer 210M'. Circuit 311 may include S1 switches which, with respect to one another, are to provide similar switching operation and switches S2 which, with respect to one another, are to provide similar switching operation which is complementary to that of the S1 switches. For example, the S1 switches may both be concurrently be in the same closed (or open) state based on a switch signal while the switches S2 of circuit 311 are each to be in a complementary open (or closed) state based on that switch signal.

In circuit 311, respective reference (e.g. ground) electrodes of transducers 210B', 210M' may be coupled to one another via a S1 switch, and respective drive/sense electrodes of transducers 210B', 210M' may also be coupled to one another via a S1 switch. A S1 switch may be coupled in series with a S2 switch between the reference electrode of transducer 210B' and the reference electrode of transducer 210M'. Another S2 switch may be further coupled between the reference electrode of transducer 210B' and the drive/sense electrode of transducer 210M'. As with circuit 310, the S1 switches of circuit 311 may be closed, and the S2 switches open in a Tx mode of operation, resulting in transducers 210B', 210M' being coupled in parallel with one another. By contrast, a Rx mode of operation may include the S1 switches of circuit 311 being open, and the S2 switches being closed to couple transducers 210B', 210M' in series with one another.

The switches S1, S2 of circuit 310 and/or circuit 311 may be to a controller (not shown). In an embodiment, such a controller may provide one or more control signals which, for example, entail a voltage step of sufficient magnitude (e.g., 1V-100 V) to change the state of one or more MEMS switches as a function of time. In first embodiments, such a controller further includes logic gates implemented with additional MEMS switches, for example, further coupled to a controlled high voltage source. For such embodiments, the controller may be monolithically integrated onto the transducer substrate, along with switches S1, S2. In second embodiments, the controller is implemented off the transducer substrate, for example in a CMOS ASIC with control signal lines then extending to the transducer substrate (e.g., as part of a flex cable, etc.).

Figure 3C:
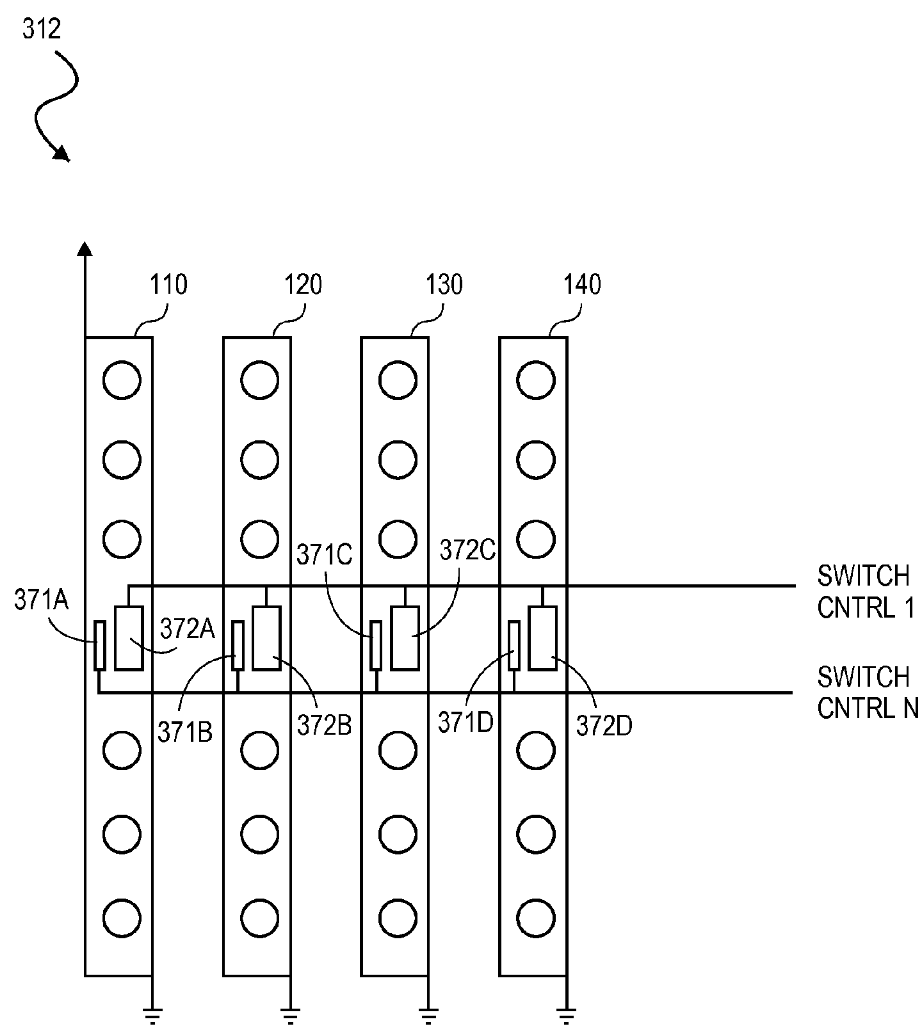
FIG. 3C is a schematic illustrating switch control lines coupled to MEMS switches across a plurality of transducer channels, in accordance with an embodiment.

In embodiments where a plurality of transducers form one channel of a multi-channeled array, for example as illustrated in FIG. 3C, each channel of the array is switchable between a first state having transducers within each channel in parallel (e.g., all transducers in one channel in parallel) and a second state having a first subset of transducers in each channel in series with a second subset of transducers in each channel (e.g., one half of the transducers in each channel in series with the other half of the transducers). In specific embodiments where each channel has the same number of transducers, each channel is switched into one of two identical transducer circuit configurations (all transducers in parallel or one half transducers in series with second half for parallel-serial interconnection) as a function of the mode in which the given channel is operating over a given time period. In this manner, only a few control lines may be needed to control a number of switches disposed on the transducer array with a same control line utilized to actuate one or more MEMS switch in each of the channels concurrently. FIG. 3C is a schematic illustrating switch control lines coupled to MEMS switches across a plurality of transducer channels 110, 120, 130, and 140 making up a multi-channeled array 312, in accordance with an embodiment. As shown, a first control signal line "switch cntrl 1" is coupled to a MEMS switch 372A interconnecting transducers over the channel 110, and is similarly coupled to switches 372B, 372C, and 372D, all of which are interconnecting transducers within the corresponding channel. Hence, during operation of the array 312, a switch controller sets a state of "switch cntrl 1" and causes the switch(es) 372A to interconnect transducers of the channel 110 in a first circuit topology (e.g., all parallel) and then resets the state of "switch cntrl 1" and causes the switch(es) 372A to interconnect transducers of the channel 110 in a second circuit topology (e.g., a first subset in series with a second subset). With the setting of the switch(es) 372A, the switch(es) 372B-372D are also set to the same state. A scanning of the array 312 may then proceed with all the switches 372A-372D in the same state, or alternatively, the switches 372A-372D may switch states as the different channels of the array are scanned. Depending on the number of switches and/or modes of operation supported by each channel, one or more additional control line (e.g., "switch cntrl N") may be further connected to other MEMS switches interconnecting various transducers in each channel (e.g., 371A-371D).

Figure 4A:
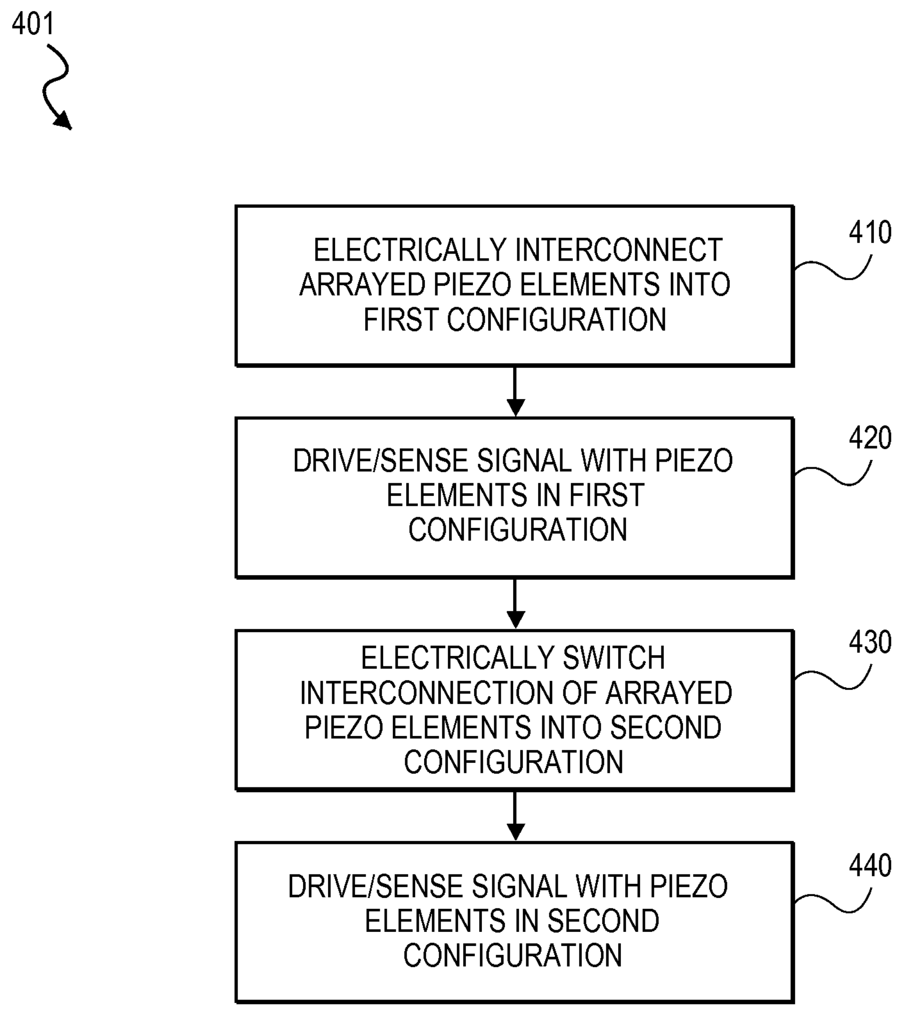
FIG. 4A is a flow diagram of a method to operate a transducer array in a plurality of modes, in accordance with an embodiment.

With a number of exemplary multi-mode, switchable micromachined transducer array architectures now described, methods of operating such multi-mode arrays is now described. FIG. 4A is a flow diagram of a method 401 to specifically operate a piezoelectric transducer array in a plurality of modes, in accordance with an embodiment. The method 401 begins at operation 410 where piezoelectric transducer elements are electrically interconnected in a first configuration with a first circuit topology. At operation 420, a drive or sense signal is applied through the first circuit topology, for example to drive or sense a transducer resonance in the ultrasonic band. At operation 430, the arrayed piezoelectric transducer elements are electrically switched into a second configuration with a second circuit topology, different than the first. Then, at operation 440, a drive or sense signal is applied through the second circuit topology, for example to drive or sense a transducer resonance in the ultrasonic band.

Figure 4B:
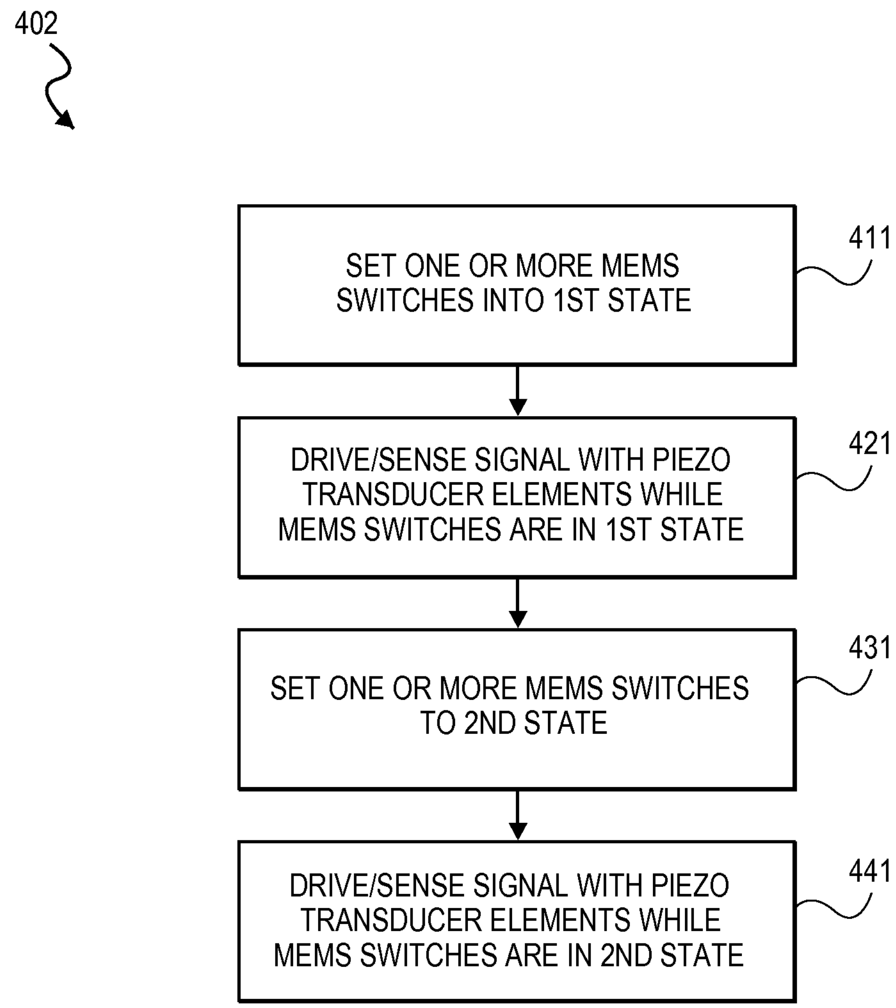
FIG. 4B is a flow diagram of a method of switching one or more MEMS switches between a drive and sense operations of a transducer array.

FIG. 4B is a flow diagram of a method 402 for switching one or more MEMS switches between a drive and sense operations of a transducer array. The method 402 may for example be applied to MEMS switches present in a particular channel of a transducer array, and may further be applied across a plurality of MEMS switches spanning multiple channels of the transducer array. The method 402 begins at operation 411 with setting one or more MEMS switches to a first state (e.g., open or closed). At operation 421, a drive or sense signal is coupled to the channel of transducers through the MEMS switches in the first state, for example to drive or sense a resonance in the ultrasonic band. At operation 431 the one or more MEMS switches set to the first state at operation 421 are changed to a second (alternate) state. At operation 441, a drive or sense signal is coupled to the channel of transducers through the MEMS switches in the second state, for example to drive or sense a resonance in the ultrasonic band.

Figure 4C:
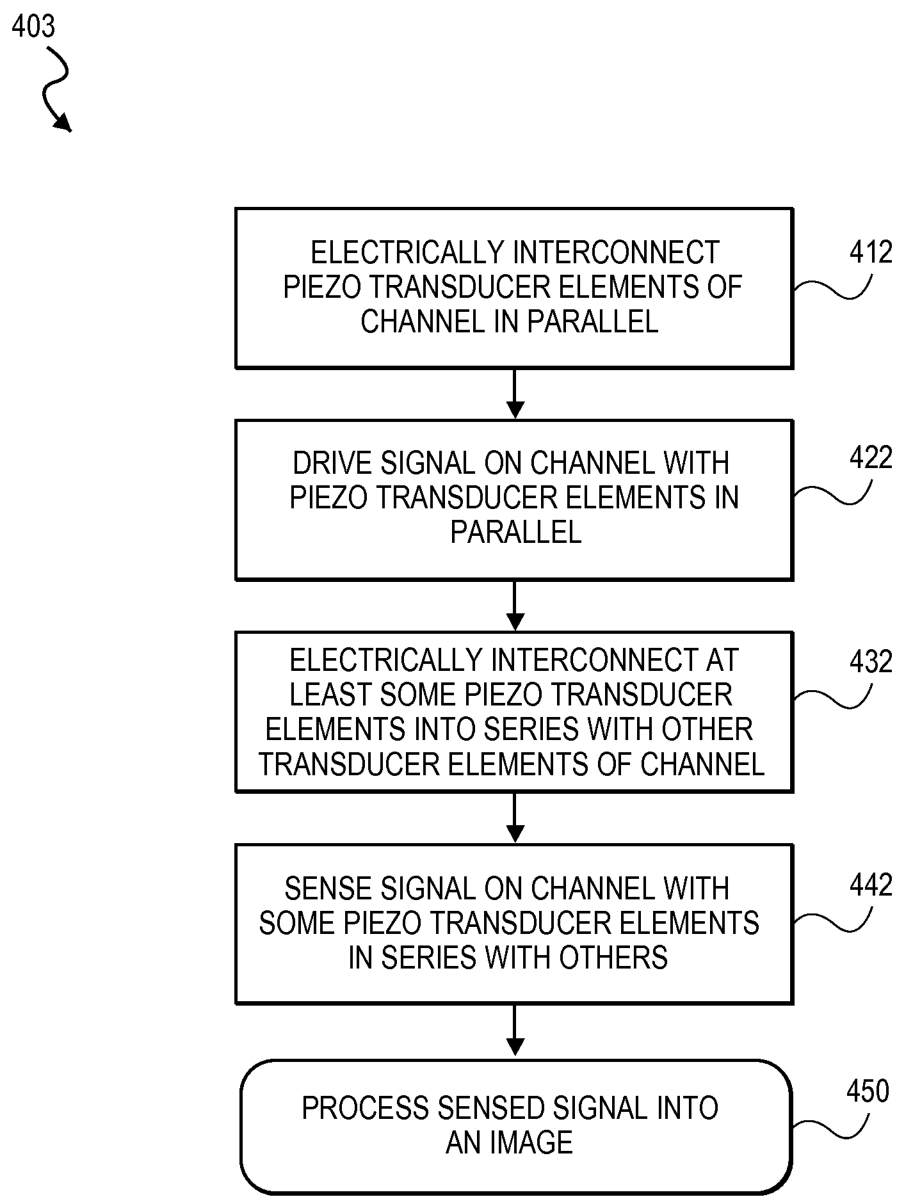
FIG. 4C is a flow diagram of a method of switching one or more MEMS switches to drive a plurality of transducers in parallel and sense the plurality of transducers with at least some of the plurality in series, in accordance with an embodiment.

FIG. 4C is a flow diagram of a method 403 of switching one or more MEMS switches to drive a plurality of transducers in parallel and sense the plurality of transducers with at least some of the plurality in series, in accordance with an embodiment. The method 403 may, for example, be performed through execution of one or more of the methods 401 and 402. Referring to FIG. 4C, the method 403 begins with operation 410 where piezoelectric transducers (transducer elements) of a channel in an array are electrically interconnected in parallel. At operation 422 a drive signal waveform is applied to the channel with the piezoelectric transducers in parallel. Next, at operation 432, at least some of the piezoelectric transducers are electrically interconnected in series with other transducers of the channel. At operation 442, a signal is sensed from the channel with some piezoelectric transducers in the channel in series with others. The method 403 then completes with processing the sensed signal into an image at operation 450, for example by using any conventional technique.

Figure 5A:
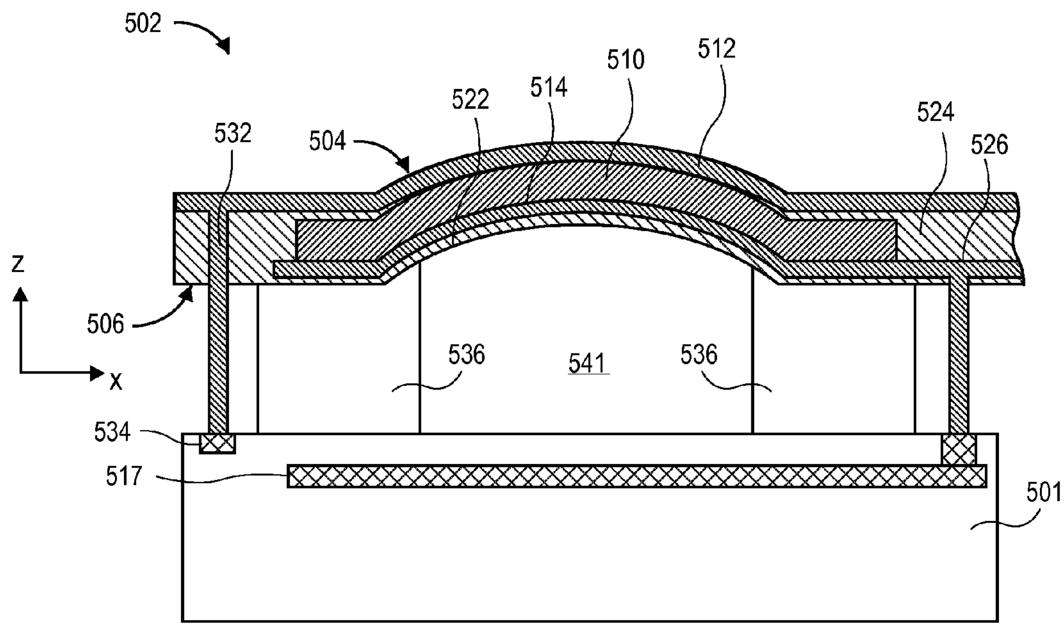
FIGS. 5A, 5B, and 5C are cross-sectional views of piezoelectric transducer elements, one or more of which is employed in a MEMS switchable pMUT array, in accordance with embodiments.
Figure 5B:
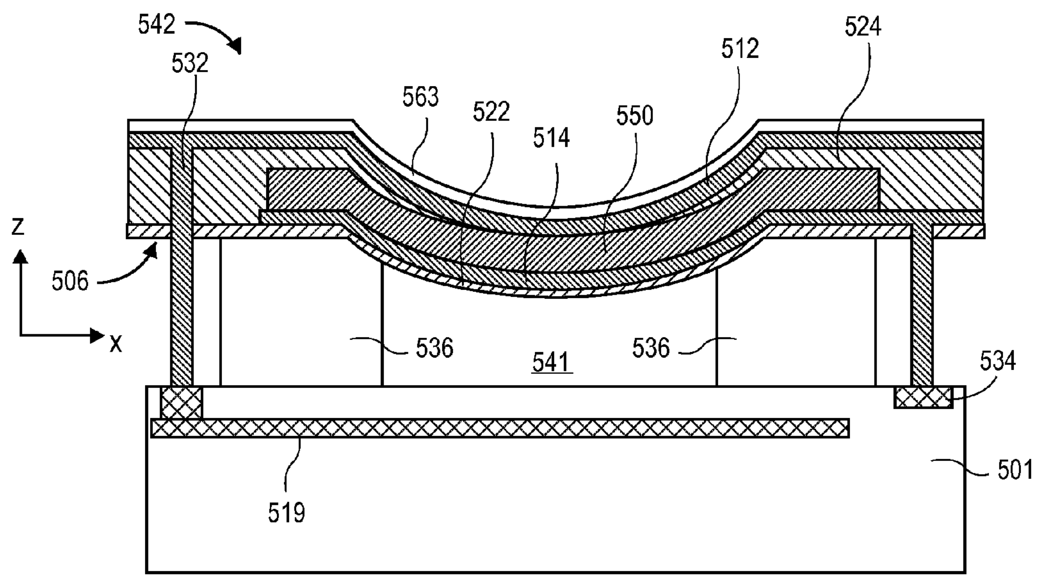
Figure 5C:
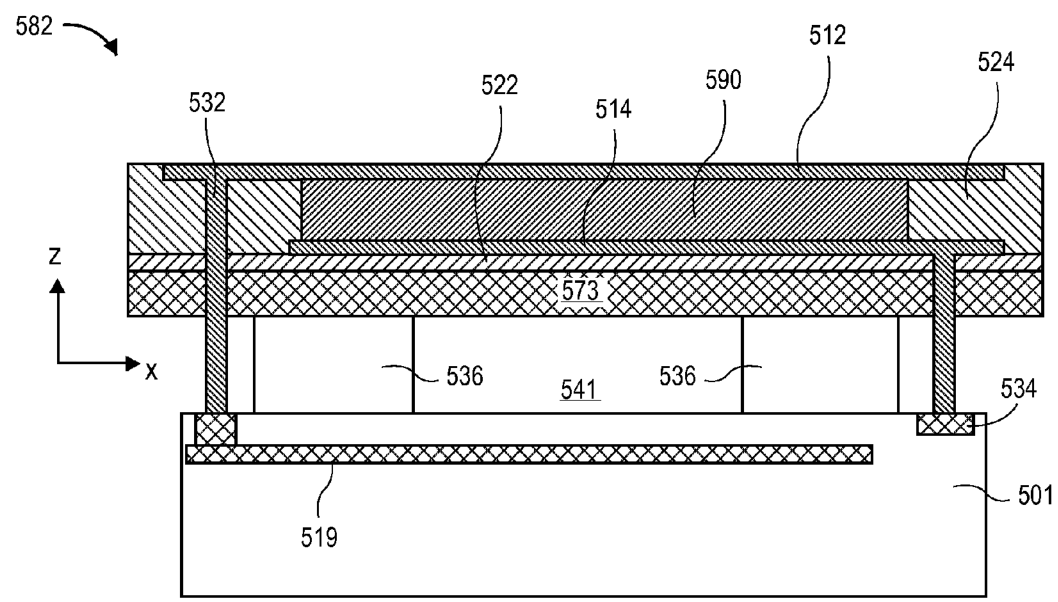
Figure 6:
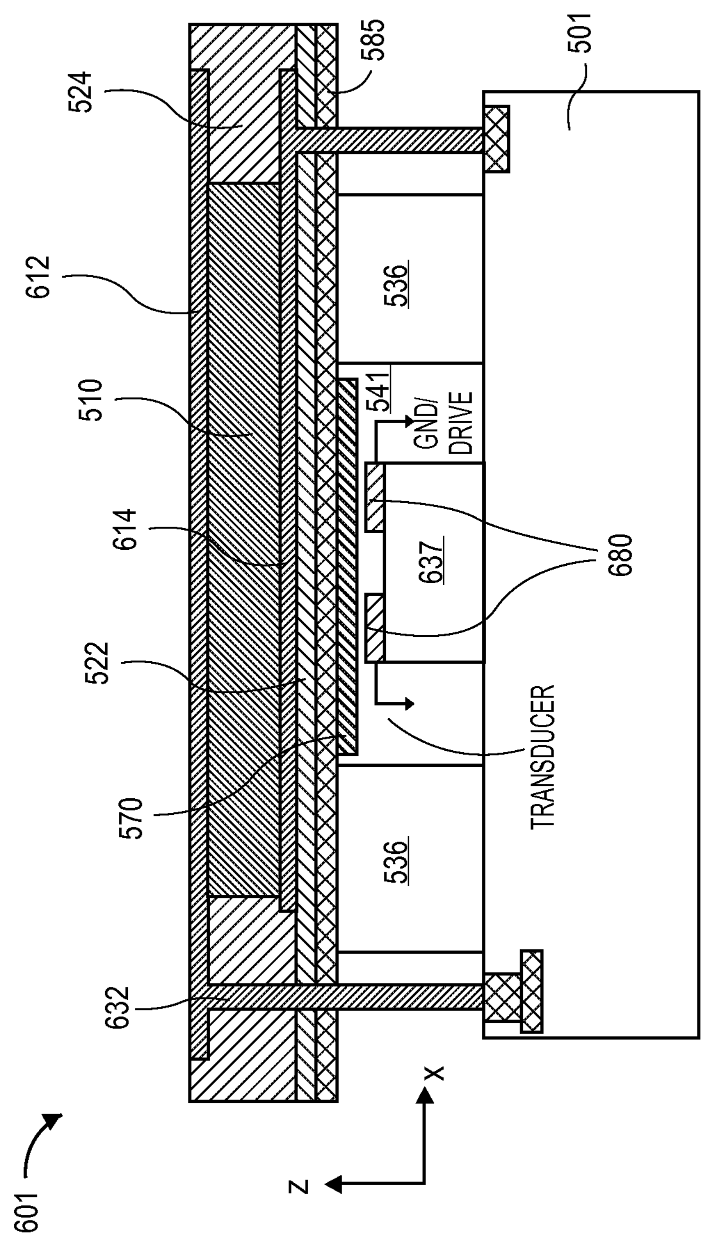
FIG. 6 is a cross-sectional view of a piezoelectric MEMS switch element which is employed in a MEMS switchable pMUT array, in accordance with an embodiment.

FIGS. 5A, 5B, and 5C are cross-sectional views of piezoelectric transducer elements, one or more of which is employed in a MEMS switchable transducer array, in accordance with embodiments. In the context of FIGS. 5A-5C, exemplary structural aspects of individual transducer elements are now briefly described. It is to be appreciated that the structures depicted in FIGS. 5A-5C are included primarily as context for particular aspects of the present invention and to further illustrate the broad applicability of the present invention with respect to piezoelectric transducer element structure. FIG. 6 is a cross-sectional view of a piezoelectric switch element, which may be employed in a MEMS switchable transducer array, in accordance with an embodiment and further illustrates monolithic integration of a piezoelectric MEMS switch into a piezoelectric transducer substrate.

In FIG. 5A, a convex transducer element 502 includes a top surface 504 that during operation forms a portion of a vibrating outer surface of a MEMS switch pMUT array, for example. The transducer element 502 also includes a bottom surface 506 that is attached to a top surface of the transducer substrate 501. The transducer element 502 includes a convex or dome-shaped piezoelectric membrane 510 disposed between a reference electrode 512 and a drive/sense electrode 514. In one embodiment, the piezoelectric membrane 510 can be formed by depositing (e.g., sputtering) piezoelectric material particles in a uniform layer on a profile-transferring substrate (e.g., silicon) that has a dome formed on a planar top surface, for example. An exemplary piezoelectric material is Lead Zirconate Titanate (PZT), although any known in the art to be amenable to conventional micromachine processing may also be utilized, such as, but not limited to doped polymethylrnethacrylate (PMM) polymer particles, Polyvinylidene fluoride (PVDF), single crystal PMN-PT, BaTiO3 and aluminum nitride (AlN). The drive/sense electrode and reference electrode 514, 512 can each be a thin film layer of conductive material deposited (e.g., by PVD, ALD, CVD, etc.) on the profile-transferring substrate. The conductive materials for the drive electrode layer can be any known in the art for such function, such as, but not limited to, one or more of Au, Pt, Ni, Ir, etc.), alloys thereof (e.g., AdSn, IrTiW, AdTiW, AuNi, etc.), oxides thereof (e.g., $IrO_2$, $NiO_2$, $PtO_2$, etc.), or composite stacks of two or more such materials.

As further shown in FIG. 5A, in some implementations, the transducer element 502 can optionally include a thin film layer 522, such as silicon dioxide that can serve as a support and/or etch stop during fabrication. A dielectric membrane 524 may further serve to insulate the drive/sense electrode 514 from the reference electrode 512 in regions external to the piezoelectric membrane 510. Vertically-oriented electrical interconnect 526 connects the drive/sense electrode 514 to a drive/sense channel and/or a MEMS switch via the drive/sense electrode rail 517. A similar interconnect 532 connects the reference electrode 512 to a reference rail 534. An annular support 536, having a hole 541 with an axis of symmetry defining a center of the transducer element 502, mechanically couples the piezoelectric membrane 510 to the transducer substrate 501. The support 536 may be of any conventional material, such as, but not limited to, silicon dioxide, polycrystalline silicon, polycrystalline germanium, SiGe, and the like. Exemplary thicknesses of support 536 range from 10-100 μm and exemplary thickness of the membrane 524 range from 1-15 μm with exemplary diameters of the membrane 510 ranging from 10-200 μm for embodiments with fundamental resonance in the ultrasonic band, for example 1-50 MHz.

FIG. 5B shows another example configuration for a transducer element 542 in which structures functionally similar to those in transducer element 502 are identified with like reference numbers. The transducer element 542 illustrates a concave piezoelectric membrane 550 that is concave in a resting state. The drive/sense electrode 214 is disposed below the bottom surface of the concave piezoelectric membrane 550, while the reference electrode 512 is disposed above the top surface and coupled to the reference electrode rail 517.

FIG. 5C shows another example configuration for a transducer element 582 in which structures functionally similar to those in transducer element 502 are identified with like reference numbers. The transducer element 582 illustrates a planar piezoelectric membrane 590 that is planar in a resting state and unlike the elements 502, operates in bending mode and therefore further employs a membrane 575 (typically of silicon). Here again, the drive/sense electrode 514 is disposed below the bottom surface of the planar piezoelectric membrane 590, while the reference electrode 512 is disposed above the top surface. An opposite electrode configuration from that depicted in each of FIGS. 2A-2C is of course also possible.

FIG. 6 is a cross-sectional view of a piezoelectric MEMS switch element 601, which is employed in a MEMS switchable transducer array, in accordance with an embodiment. To emphasize the monolithic nature of the MEMS switch element 601 and the transducer elements 502, 524 and 526, structures in FIG. 6 compatible with those in transducer elements of FIGS. 5A-5C are identified with like reference numbers. As illustrated, the MEMS switch element 601 includes a fixed beam switching member although in alternative embodiments a cantilever beam, etc. may be employed. The switch element includes the planar piezoelectric membrane 590 disposed over a membrane 585 (e.g., of metal or heavily doped silicon) suitable for bending mode operation. Alternatively or in addition, a metallic strip 570 may be disposed on the underside of membrane 585 and/or membrane 590 to provide for shorting of contacts 680 disposed on a recessed support 637 when there is sufficient deflection of one or both of membranes 585, 590. The switch drive electrode 614 is disposed below the bottom surface of the planar piezoelectric membrane 590, while a reference electrode 612 is disposed above the top surface of piezoelectric membrane 590. The order of electrodes can be reversed as well (i.e., top electrode can be used as the drive and the bottom electrode as the reference). The thin film layer 522, such as silicon dioxide dielectric layer, etc., serves a further function of blocking the drive signal from shorting to the lower electrodes 680 during switch actuation. When the piezoelectric membrane 590 deflects in response to a drive (switch control) signal, high frequency transducer signals may pass between electrodes of consecutive transducers in an array. When no drive signal is present, and the piezoelectric membrane 590 is not deflected sufficiently, capacitive coupling is insufficient to pass the high frequency transducer drive/sense signals thereby selectably isolating or coupling given transducer elements. As many alternative switch architectures are known in the art, the interested reader is referred to the literature for further description of piezoelectric MEMS switches suitable for selectably configuring transducer elements of an array into alternate circuit topologies as described herein.

Figure 7:
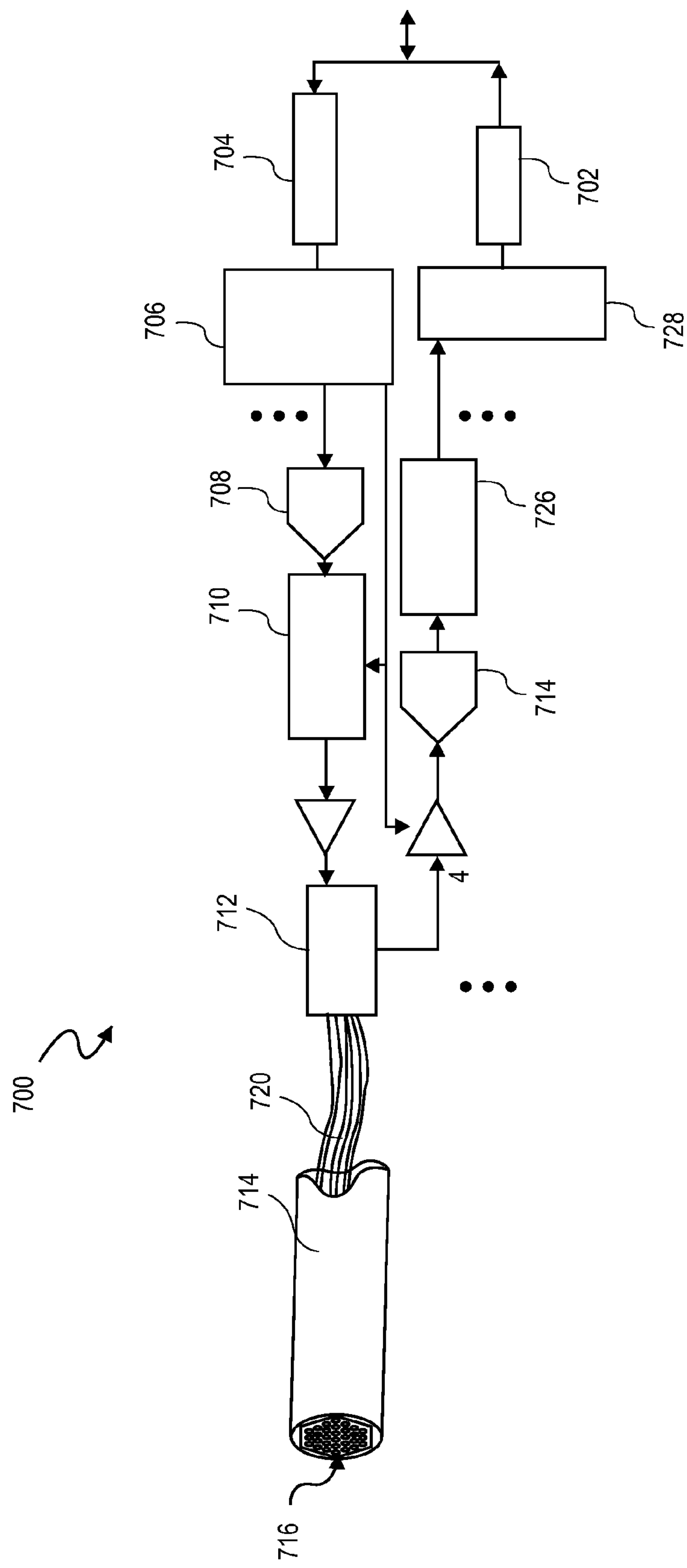
FIG. 7 is a functional block diagram of an ultrasonic imaging system, which employs a micromachined piezoelectric array, in accordance with an embodiment of the present invention.

FIG. 7 is a functional block diagram of an ultrasonic transducer apparatus 700 that employs a pMUT array, in accordance with an embodiment of the present invention. In an exemplary embodiment, the ultrasonic transducer apparatus 700 is for generating and sensing pressure waves in a medium, such as water, tissue matter, etc. The ultrasonic transducer apparatus 700 has many applications in which imaging of internal structural variations within a medium or multiple media is of interest, such as in medical diagnostics, product defect detection, etc. The apparatus 700 includes at least one MEMS switchable array 716, which may be any of the MEMS switchable arrays described elsewhere herein having any of the MEMS addressable transducer elements. In exemplary embodiment, the MEMS switchable array 716 is a 2D transducer array housed in a handle portion 714 which may be manipulated by machine or by a user of the apparatus 700 to change the facing direction and location of the outer surface of the MEMS switchable array 716 as desired (e.g., facing the area(s) to be imaged). Electrical connector 720 electrically couples the drive/sense channels of the array 716 to a communication interface of the transducer substrate and external to the handle portion 714.

In embodiments, the apparatus 700 includes a signal generator, which may be any known in the art, coupled to the MEMS switchable array 716, for example by way of electrical connector 720. The signal generator is to provide an electrical drive signal on various drive/sense channels. In one specific embodiment, the signal generator is to apply an electrical drive signal to cause an addressed piezoelectric transducer element to resonate at frequencies between 1 MHz and 50 MHz. In certain embodiments, the signal generator is any high voltage pulse generator known in the art. In other embodiments where transmit beamforming is utilized, the signal generator includes a de-serializer 704 to de-serialize control signals that are then de-multiplexed by demux 706. A digital-to-analog converter (DAC) 708 is then to convert the digital control signals into driving voltage signals for the individual transducer element channels in the MEMS switchable pMUT array 716. Respective time delays can be added to the individual drive voltage signal by a programmable time-delay controller 710 to beam steer, create the desired beam shape, focus, and direction, etc. across channels of the array and/or across transducer elements of a given channel. Coupled between the channel connector 702 and the signal generator is a controller 712 responsible for sending MEMS switch control signals over control channels of the connector 702 to the MEMS switches of the MEMS switchable array 716. The controller 712 may further include a switch network to switch between drive and sense modes in a manner coordinated with states of the MEMS switches. In this manner, one or more signal generator applies an electrical drive signal to transducers connected in parallel through the one or more MEMS switches.

In embodiments, the apparatus 700 includes a signal receiver, which may be any known in the art, coupled to the MEMS switchable transducer array 716, for example by way of electrical connector 720. The signal receiver is to collect an electrical sense signal from the drive/sense electrode channels in the MEMS switchable transducer array 716 with two or more transducers connected in series through the one or more MEMS switches. In one exemplary embodiment of a signal receiver, an analog to digital converter (ADC) 714 is to receive voltage signals and convert them to digital signals. The digital signals may then be stored to a memory (not depicted) or first passed to a signal processor. An exemplary signal processor includes a data compression unit 726 to compress the digital signals. A multiplexer 718 and a serializer 728 may further process the received signals before relaying them to a memory, other storage, or a downstream processor, such as an image processor that is to generate a graphical display based on the received signals.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.), unless an input of one operation inherently relies on an output of another operation. Furthermore, many other embodiments will be apparent to those of skill in the art upon reading and understanding the above description. For example, although an ultrasonic imaging apparatus is explicitly described, sufficient detail is provided for one of ordinary skill to apply a MEMS switchable piezoelectric array to other apparatuses, such as, but not limited to piezoelectric print heads. Therefore, although the present invention has been described with reference to specific exemplary embodiments, it will be recognized that the invention is not limited to the embodiments described, but can be practiced with modification and alteration within the scope of the appended claims. The scope of the invention should, therefore, be determined with reference to the appended claims, along with the full scope of equivalents to which such claims are entitled.

What is claimed is:

1. A micromachined transducer array, comprising:

a transducer substrate;

a plurality of transducers disposed over the transducer substrate; and one or more switches disposed over the transducer substrate, wherein the one or more switches are electrically switchable between a first state and second state, the first state interconnecting at least two transducers of the plurality of transducers in electrical parallel with each other, and the second state interconnecting the at least two transducers in electrical series with each other.

2. The transducer array of claim 1, wherein the one or more switches comprise one or more MEMS switches.

3. The transducer array of claim 1, wherein the first state places all transducers of the plurality of transducers in parallel with each other, and the second state places a first subset of the plurality of transducers in series with a second subset of the plurality of transducers.

4. The transducer array of claim 3, wherein the first subset includes first transducers connected in electrical parallel with each other and the second subset includes second transducers connected in electrical parallel with each other.

5. The transducer array of claim 3, wherein the plurality of transducers comprise one channel of a multi-channeled array with each channel of the array including the same number of transducers, and each channel of the array switchable between the first state having all transducers of each channel in parallel with each other and the second state having the first subset of each channel in series with the second subset of each channel.

6. The transducer array of claim 5, wherein the one or more switches comprise MEMS switches each associated with respective channel of the array and wherein all of the first MEMS switches are coupled to a single control signal line that is to concurrently set all channels of the array into the first or second state.

7. The transducer array of claim 6, wherein the MEMS switches comprise a piezoelectric, electrostatic or electromagnetic switching member, and wherein the plurality of transducers are resonant within an ultrasonic frequency band.

8. The transducer array of claim 7, wherein each of the plurality of transducers comprises a piezoelectric material and wherein the one or more MEMS switch comprises a piezoelectric member employing a same piezoelectric material as the plurality of transducers.

9. The transducer array of claim 8, wherein the MEMS switches comprise a capacitive switch comprising a cantilever or fixed beam further comprising the piezoelectric material.

10. The transducer array of claim 6, wherein the MEMS switches comprise:

a first MEMS switch connected in series between a ground electrode of a first transducer and a drive electrode of a second transducer;

a second MEMS switch connected between a drive electrode of the first transducer and the drive electrode of the second transducer;

a third MEMS switch connected between the ground electrode of the first transducer and a ground electrode of the second transducer;

a fourth MEMS switch and a fifth MEMS switch connected in series with one another between the ground electrode of the first transducer and the ground electrode of the second transducer, the first and fifth MEMS switches coupled to one or more switch controllers to actuate into same open or closed states, the second, third and fourth MEMS switches coupled to the one or more switch controllers to actuate with the first and fifth MEMS switches, but in open or closed states that are complementary to those of the first and fifth MEMS switches.

11. The transducer array of claim 6, wherein the MEMS switches comprise:

a first MEMS switch connected between a drive electrode of a first transducer and a drive electrode of a second transducer;

a second MEMS switch and a third MEMS switch connected in series with one another between the drive electrode of the second transducer and a node coupling respective ground electrodes of the first and second transducers, the first and second MEMS switches coupled to one or more switch controllers to actuate into same open or closed states, the third MEMS switch coupled to the one or more switch controllers to actuate with the first and second MEMS switches, but in an open or closed state that is complementary to those of the first and second MEMS switches.

12. The transducer array of claim 10, wherein the one or more switch controllers comprise additional MEMS switches disposed over the transducer substrate or CMOS transistors disposed over a CMOS substrate.

13. An apparatus for generating and sensing pressure waves in a medium, the apparatus comprising:

the transducer array of claim 1;

one or more signal generators coupled to the transducer array to apply an electrical drive signal on a first drive/sense channel;

one or more receivers coupled to the transducer array to receive an electrical response signal from the first drive/sense channel;

one or more switch controllers connected to at least a first of the MEMS switches to couple different ones of the piezoelectric transducers in series or parallel configuration over time; and at least one signal processor coupled to the receiver to process a plurality of electrical response signals received from the drive/sense channel into an image.

14. The apparatus of claim 13, wherein the one or more signal generators are to apply an electrical drive signal to transducers connected in parallel through the one or more MEMS switches.

15. The apparatus of claim 14, wherein the one or more receivers are coupled to collect an electrical sense signal from transducers connected in series through the one or more MEMS switches.

16. The apparatus of claim 15, wherein the transducers are driven by the one or more generators to resonate at frequencies between 1 MHz and 50 MHz, wherein the transducers connected in series further comprise a first subset of the plurality of transducers in series with a second subset of the plurality of transducers, and wherein transducers within the first subset are connected in electrical parallel with each other and transducers within the second subset are connected in electrical parallel with each other.

17. A method of generating and sensing pressure waves in a medium, the method comprising:

connecting a plurality of micromachined transducers of a transducer array disposed over a transducer substrate in electrical parallel with each other during a first time period through one or more switches set to a first state;

driving the plurality of transducers with an electrical signal during the first time period;

reconnecting at least some of the plurality of transducers in electrical series with each other during a second time period by setting the one or more switches to a second state; and receiving an electrical response signal from the plurality of transducers during the second time period.

18. The method of claim 17, wherein the connecting comprises sending one or more first control signals to the one or more switches to set the first state, and wherein the reconnecting comprises sending one or more second control signals to the one or more switches to set the second state.

19. The method of claim 18, wherein the transducer array comprises a plurality of channels, with each channel including a plurality of transducers, and wherein sending the one or more first and second control signals further comprises sending the same first and second control signals to MEMS switches in each of the plurality of channels concurrently.

20. The method of claim 18, wherein the transducers comprise a piezoelectric material, and wherein sending the one or more first control signals comprises applying a voltage to an electrode coupled to a piezoelectric member of a first MEMS switch sufficient to short circuit or capacitively couple poles of the first MEMS switch, wherein the first MEMS switch is coupled between respective electrodes of two transducers.

* * * * *